United States Patent [19]

Cohen

[11] Patent Number: 4,728,907

[45] Date of Patent: Mar. 1, 1988

[54] FREQUENCY/TEMPERATURE COMPENSATED MILLIMETER WAVE OSCILLATOR

[75] Inventor: Leonard D. Cohen, Brooklyn, N.Y.

[73] Assignee: Eaton Corporation, Cleveland, Ohio

[21] Appl. No.: 938,045

[22] Filed: Dec. 4, 1986

[51] Int. Cl.[4] .......................... H03B 7/02; H03B 7/06; H03B 7/12; H03B 7/14

[52] U.S. Cl. .................. 331/107 R; 331/96; 331/107 DP; 331/107 SL; 331/176; 331/177 V

[58] Field of Search ........ 331/96, 99, 107 R, 107 DP, 331/107 SL, 107 G, 117 R, 117 FE, 117 D, 176, 177 V

[56] References Cited

U.S. PATENT DOCUMENTS 4,246,550 1/1981 Cohen ........................ 331/107 DP
4,333,062 6/1982 Uwano ........................ 331/176 X

FOREIGN PATENT DOCUMENTS 0108407 6/1984 Japan ............................... 331/176

OTHER PUBLICATIONS

"Frequency/Temperature Compensated Millimeter-Wave Oscillators and Broadband VCO's in Lumped-Element and Printed-Circuit Forms", Leonard D. Cohen and Nathaniel King, Jr., 1986 IEEE MTT-S International Microwave Symposium Digest, Jun. 2-4, pp. 169-172.

"Varactor Tuned Gunn Oscillators With Wide Tuning Range for the 25 to 75 GHz Frequency Band", Leonard D. Cohen, presented at the 1979 IEEE-MTT-S International Microwave Symposium, Apr. 1979, Orlando, Fla., pp. 1-3.

"Simple Stabilizing Method for Solid-State Oscillators", A. Kondo, T. Ishii and K. Shirahata, IEEE Trans. on Microwave Theory and Techniques, Nov. 1974, pp. 970-972.

"A 26-GHz Miniaturized MIC Transmitter/Receiver", E. Hagihara, H. Ogawa, N. Imai and M. Akaike, IEEE Trans. on Microwave Theory and Techniques, vol. MTT-30, No. 3, Mar., 1982, pp. 235-242.

"Thermal Compensation of Varactor-Tuned Oscillators", E. Levine, Microwaves & RF, Aug. 1983, pp. 81-83.

"Stabilisation of a W-Band Microstrip Oscillator by a Dielectric Resonator", G. Morgan, Electronic Letters, vol. 18, No. 13, Jun. 24, 1982, pp. 556-558.

"Voltage-Controlled Oscillators Evaluated for System Design", R. M. Leier and R. W. Patston, MSN & CT, Nov. 1985, pp. 102-120.

"PROM Stabilizes mm-wave LOs", Microwaves & RF, Sep. 1985, pp. 147-151, Schroth, J. et al.

"Voltage Variable Capacitor Tuning: A Review", Marcus H. Norwood and Ephraim Shatz, Proceedings of the IEEE, vol. 56, No. 5, May 1968, pp. 788-798.

Primary Examiner—Eugene R. LaRoche
Assistant Examiner—David Mis
Attorney, Agent, or Firm—Andrus, Sceales, Starke & Sawall

[57] ABSTRACT

Frequency/temperature compensation of millimeter wave lumped active element oscillators is disclosed by use of a simple capacitive compensating element, and including printed circuit versions in which the temperature compensating capacitor is printed in-situ with the circuit elements.

26 Claims, 14 Drawing Figures

MEASURED PERFORMANCE OF UNCOMPENSATED AND TEMPERATURE COMPENSATED MILLIMETER WAVE LUMPED ELEMENT GUNN OSCILLATOR

FIG. 8  MEASURED FREQUENCY VS TUNING VOLTAGE AS A FUNCTION OF TEMPERATURE (°C).
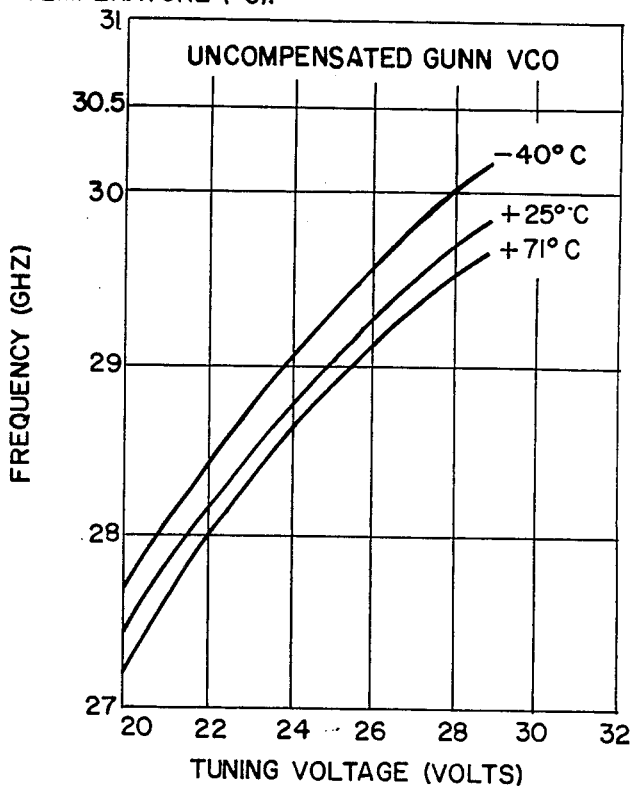
FIG. 9  MEASURED FREQUENCY VS TUNING VOLTAGE AS A FUNCTION OF TEMPERATURE (°C).
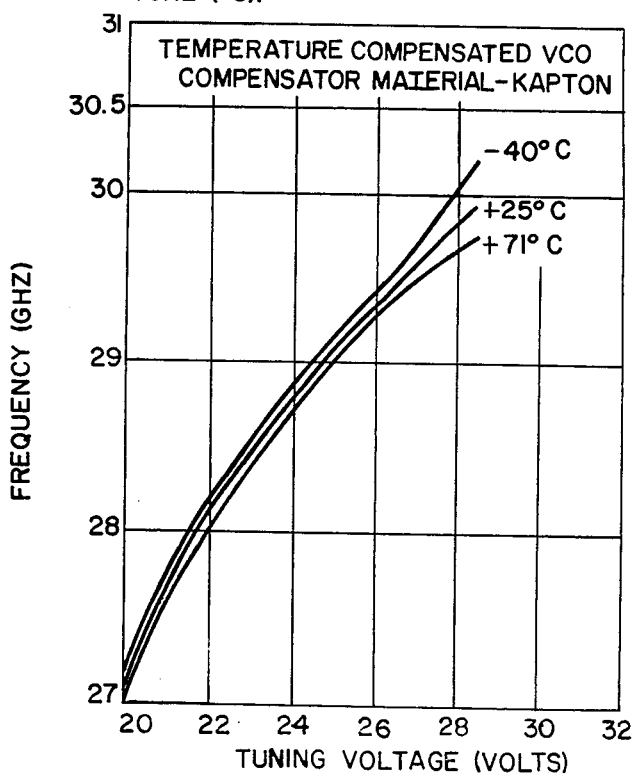

FREQUENCY/TEMPERATURE COMPENSATED MILLIMETER WAVE OSCILLATOR

BACKGROUND

The invention relates to oscillators, including varactor tuned oscillators (VCOs), operational in the millimeter wave range including frequencies greater than 30 GHz, and more particularly to circuitry for maintaining a near constant operating frequency of the oscillator over a large ambient temperature range to provide improved frequency versus temperature stability. The invention also provides improvements in further miniaturization and reduced cost.

Oscillators, including VCOs, are used extensively in military and commercial electronic equipment as local oscillators for transmitter sources. Frequency stability over a wide ambient temperature range is a basic requirement for high quality performance. In many applications, such as missile seekers of smart munitions, miniature size and low cost are concomittant requirements with frequency/temperature stability. A means to stabilize the operating frequency of oscillators in the millimeter wave range, including frequencies greater than 30 GHz, over a wide ambient temperature range was not heretofore realistic due to physical and electrical constraints in extrapolating conventional technology from the microwave range.

Conventional oscillator technology and stabilization techniques that have been used in the microwave frequency range up to 18 GHz become mechanically difficult to implement, costly and generally impractical when applied to the millimeter wave range, e.g., 30 to 100 GHz. This basically follows from the diminutive part size dictated by an extrapolation from conventional temperature compensated microwave oscillator technology. For example, mechanical arrangements with a differential expansion tuning element are conventionally used in the microwave bands to compensate for a change in oscillator frequency due to the dimensional change in oscillator cavity size with temperature. At X-band (8 to 12 GHz) the cross section of a typical rectangular waveguide cavity is 0.900 inches wide by 0.400 inches high. At millimeter wavelengths, e.g., 60 GHz, the cross section of a rectangular waveguide cavity would be only 0.148 inches wide by 0.074 inches high. These relatively small dimensions place severe if not impractical constraints on the size and fabrication tolerances needed for a differential expansion type frequency compensator. These constraints in conjunction with the precise mechanical adjustment needed for proper frequency compensation over a wide ambient temperature range increase cost and present substantial practical problems of reproducibility as a production oriented technique.

Another example of the limitation to the extension of conventional frequency compensated oscillator technology to the millimeter wave range is dielectric resonator oscillator (DRO) technology. This technology is near the limit of its effectiveness and practicality in the 20 GHz range. The upper frequency limit of commercial DROs is only 20 GHz after many years of DRO technology development. This is due to the small size and low O of a dielectric resonator when scaled for use at millimeter frequencies. The high dielectric constant of the resonator ceramic type material is another contributor to both the diminishing size of the resonator and its low O factor. The significant degradation in DRO performance at millimeter wavelengths is evidenced by reported results with experimental DROs at 26 GHz, "A 26 GHz Miniaturized MIC Transmitter/Receiver", E. Hagihara, H. Ogawa, N. Imai and M. Akaike, IEEE Trans. MTT, Vol. MTT-30, No. 3, March 1982, and 87 GHz, "Stabilization of a W-Band Microstrip Oscillator by a Dielectric Resonator", G. Morgan, Electronic Letters, June 24, 1982, Vol. 18, No. 13. The 26 GHz DRO had a frequency temperature stability of 1.4 ppm/°C. over a temperature range limited to −5° C. to +50° C., and the 87 GHz DRO had a significantly degraded stability of 23 ppm/°C. over a more restricted temperature range of +20° C. to +60° C. The constriction of temperature range with increasing frequency is an indicator of the loss of effectiveness of DRO technology in the millimeter wave range.

Reaction or transmission cavity type stabilization using low expansion material, e.g., invar, also has limited effectiveness in the millimeter range due to small cavity size and concomitant low Q factor, and restricted operating temperature range.

Conventional stabilization techniques have been limited to oscillators and have not been applied to broadband VCOs because of the difficulty in matching positive and negative reactance slope changes of an oscillator with that of a compensating structure over a wide frequency and temperature range. Frequency stabilization of a VCO by use of heater power to maintain a near constant VCO temperature has been used but is not a viable approach in systems with several VCOs and limited prime power, e.g., a missile seeker or a smart munition. Frequency compensation of a VCO by an external thermistor circuit has been reported, "Thermal Compensation of Varactor Tuned Oscillators", E. Levine, Microwaves and RF, August 1983, pp. 81–83, but compensation is only marginally effective (12 ppm/°C.) over the limited temperature range of −5° C. to +55° C.

Problems and deficiencies of the prior art are summarized as follows:

Known frequency stabilization techniques are not adequate and therefore are not used for stabilization of microwave and millimeter wave VCOs over broad frequency and temperature ranges.

It is difficult if not impractical to extrapolate known microwave stabilization techniques such as dielectric resonators (DROs), cavity stabilizers or differential expansion compensators to the millimeter range for frequency stabilization of oscillators.

The use of an external heater to maintain a constant oscillator or VCO temperature is disadvantageous because of significant prime power consumption.

The size of oscillators stabilized by known techniques is large for applications requiring oscillators of miniature size. A distributed type circuit, i.e., waveguide, is inherently larger than the lumped element compensated circuit of the present invention.

The basis of known frequency stabilization techniques is to match positive and negative reactance slope changes of the oscillator over frequency and temperature with that of some form of a compensating element, e.g., differential expansion tuning element. Frequency stability with temperature has also been achieved by minimizing the reactance change of the oscillator circuit elements themselves over temperature, e.g., use of low expansion invar as a cavity material.

Known frequency compensation techniques address reactance change with temperature as an average effect for the total oscillator circuit. Known causes of frequency drift with temperature are the cavity embodiment, the temperature dependence of the active element, e.g., Gunn or Impatt diode, or FET, and in the case of a VCO, the temperature dependence of varactor capacitance. Known techniques treat all of these effects as a sum. In the present invention, lumped or printed element forms of the circuit embodiment used provide open and ready access to individual circuit elements, e.g., Gunn and varactor diodes, and each element can be individually compensated, thereby providing a more exact compensation.

Known frequency compensation of a microwave oscillator is waveguide form with a high dielectric constant (e.g., greater than 40) capacitor, "Simple Stabilizing Method for Solid State Oscillators", A. Kondo, T Ishii, and K. Shirahata, IEE Trans. in Microwave Theory and Techniques, November 1974, pp. 970–972, is difficult if not impractical to implement at millimeter wave frequencies due to its diminishing size with frequency. In the distributed type circuit described in Kondo et al, the compensating capacitor constitutes an additional circuit element. In the lumped element or printed circuit forms of the present invention, the compensating capacitor can be substituted for the oscillator resonator capacitor and thereby not increase the parts count. In addition, the circuit form of the present invention permits use of a low dielectric constant compensator material, e.g. less than 15, which is particularly desirable for higher frequencies. The compensating capacitor of the present invention can also be printed in-situ with the other elements of a printed circuit since specific and known substrate materials used for microwave printed circuits are also suitable for an appropriately sized compensating capacitor. The compensating capacitor described in Kondo et al cannot be printed due to its complex material composition and dissimilarity to substrate materials suitable for printed microwave and millimeter wave circuits.

The physical form of a distributed circuit, i.e., waveguide, results in a relatively larger circuit size than that of the lumped element circuit of the present invention. Larger size means that a larger temperature difference can exist between various parts of the circuit when a change in ambient temperature occurs. Incomplete frequency compensation occurs until a steady state condition is reached. In the lumped element embodiment of the present invention, a steady state condition is reached in a shorter time than in a distributed circuit because of the smaller size, e.g., ⅛ inch by ⅛ inch at 40 GHz. Hence, the compensate lumped element oscillator, including VCO, frequency stabilizes more rapidly than a compensated distributed type oscillator.

SUMMARY

The invention provides a frequency versus temperature stabilized oscillator, including VCO (varactor tuned oscillator), that operates over a broad frequency and temperature range in the microwave and millimeter wave frequency bands in both lumped element and printed microstrip form and combinations thereof. The lumped element circuit form is operational at microwave and millimeter wave frequencies and is conductive to minimizing circuit reactance changes with temperature. The lumped element VCO circuit, with lumped element frequency/temperature compensator, is inherently more broadband than a distributed circuit, e.g., waveguide or co-ax, and compensation can be achieved over a broader frequency range. The lumped element circuit is physically smaller than a distributed circuit, which in turn provides lower thermal mass and more rapid response to ambient temperature changes. A lumped element chip capacitor is used to compensate individual temperature sensitive circuit elements in an oscillator, and frequency/temperature compensation is implemented more effectively than the conventional approach of providing an average compensation for total circuit effects. The open nature of the lumped element oscillator provides ready access to individual circuit elements for compensation. In a lumped element VCO, frequency change with temperature is caused by the change in capacitance of the active element, e.g., Gunn or Impatt diode, and the varactor diode. With the disclosed temperature compensated circuit, the active element and the varactor can each be individually compensated. Individual compensation of each offending element provides better oscillator frequency/temperature compensation compared to compensating for an average of the offending elements. The invention enables the use of low dielectric constant material for the compensator and the compensation can be applied at frequencies extending into the millimeter wave region, e.g., 30 to 100 GHz. Although the physical size of a compensating element decreases with frequency, the compensating element remains physically realizable at millimeter wave frequencies due to its low dielectric constant. The material used for fabrication of the compensator can also constitute the substrate material for printing an entire oscillator circuit in-situ with the compensating element.

The temperature compensating element is a lumped element chip capacitor placed in close proximity to the circuit element to be compensated, e.g., tuning varactor and/or active device such as a Gunn or Impatt diode. In a lumped element VCO, the frequency change of the VCO with temperature is caused by the temperature dependence of the capacitance of the active device and the varactor. Temperature compensation is accomplished by choosing the material of the compensating element such that the temperature coefficient of capacitance of the compensating element is equal and opposite to that of the active element and/or varactor to be compensated. Since the circuit embodiment is of the lumped element type, line length effects are non-existent and frequency compensation is achieved over a broad frequency and temperature range. In contrast, in distributed type circuits, line lengths are significant and diminish the frequency and temperature range over which compensation can be achieved. Commercial frequency/temperature compensated distributed type sources are availabe only as fixed frequency oscillators.

In commercial compensated oscillators, frequency/-temperature compensation is generally accomplished by the differential expansion of a tuning rod or cavity wall and requires precise adjustment to set the compensating mechanism for the frequency and level of compensation required. The compensation is a reactance type compensation. The reactance of the compensator is transformed to an appropriate plane of the oscillator circuit and provides an equal and opposite reactance to that causing the frequency change of the oscillator with temperature. The impedance transformation results from line length effects in the distributed oscillator circuit. The distributed nature of the circuit has a diminishing effect on the tuning capability of a VCO. In addition, after a temperature change occurs, a time lag is incurred before oscillator frequency stabilizes due to the size and thermal mass of a distributed type oscillator and its mechanical compensation mechanism.

The present invention overcomes the above disadvantages. A lumped element circuit is used which is miniature in size. The compensating capacitor is miniature, e.g., 0.020 inch by 0.020 inch. The compensated lumped element oscillator has low thermal inertia because of its miniature size and hence reduces the time required for an oscillator, including a VCO, to stabilize after a temperature change. The compensation effect does not rely on impedance transformation by line length effects and hence is inherently more broad band. The compensating capacitor or capacitors can be located directly at the element or elements to be compensated because of the open nature of a lumped element circuit. Compensation is essentially a compensation of the capacitance/temperature characteristic of an offending circuit element and is less frequency sensitive than a reactance type compensation. Since individual elements can be compensated in the disclosed lumped element circuit form, more effective compensation can be realized, in contrast to a distributed type oscillator in which compensation is for an average of all the frequency/temperature effects in the oscillator. The disclosed compensated oscillator eliminates the precise adjustment required in mechanically compensated oscillators. The adjustment for a desired degree of compensation is a simple trimming of the capacitance of the compensating capacitor.

BRIEF DESCRIPTION OF THE DRAWINGS

FIG. 8 is a graph showing the frequency/temperature characteristics of an uncompensated VCO over the temperature range −40° to +71° C.

FIG. 9 is a graph showing the frequency/temperature characteristics of a compensated VCO over a temperature range −40° to +71° C.

DETAILED DESCRIPTION

The invention is disclosed in the above drawings and the following text. The invention is also disclosed in my published article "Frequency/Temperature Compensated Millimeter-Wave Oscillators and Broadband VCO's in Lumped-Element and Printed-Circuit Forms", 1986 IEEE MTT-S Digest, pp. 169–172, incorporated herein.

Figure 1:
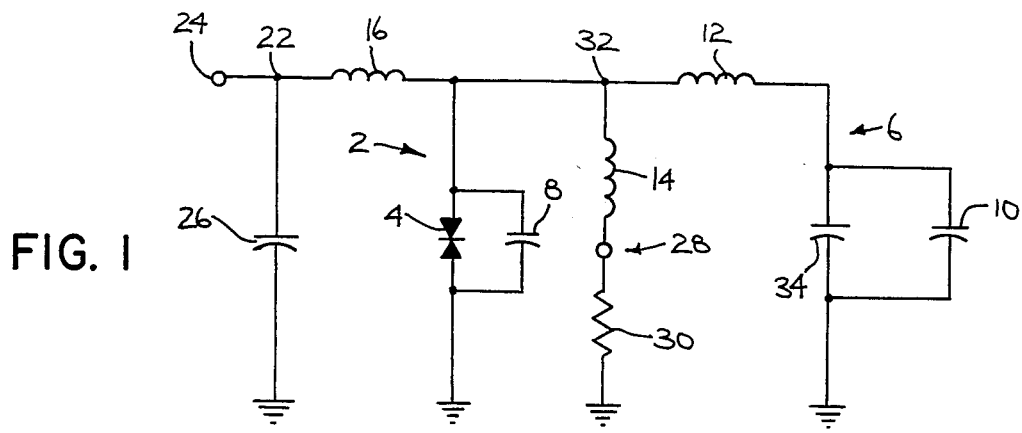
FIG. 1 is a circuit diagram showing an oscillator in accordance with the invention.
Figure 2:
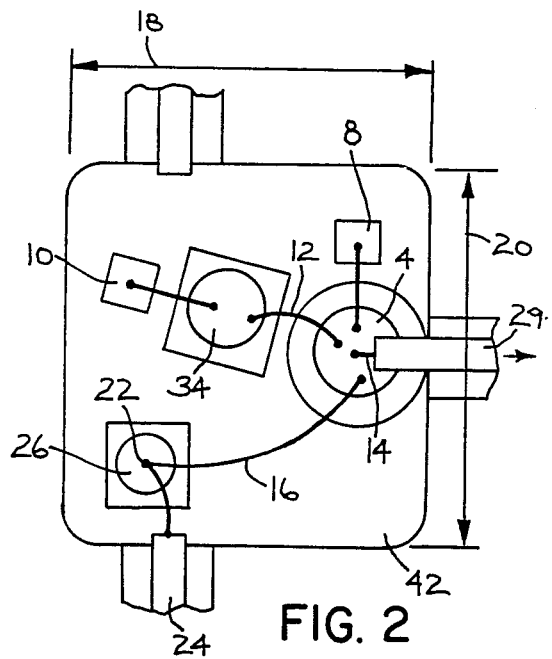
FIG. 2 shows the packaged form of the circuitry of FIG. 1.
Figure 4:
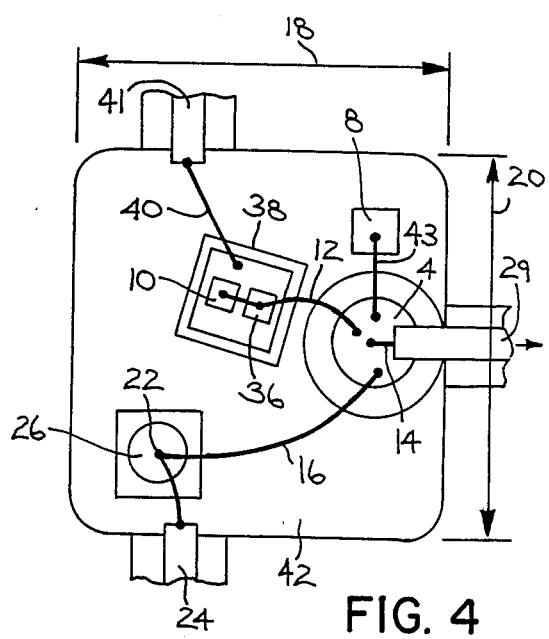
FIG. 4 shows the packaged form of the circuitry of FIG. 3.
Figure 3:
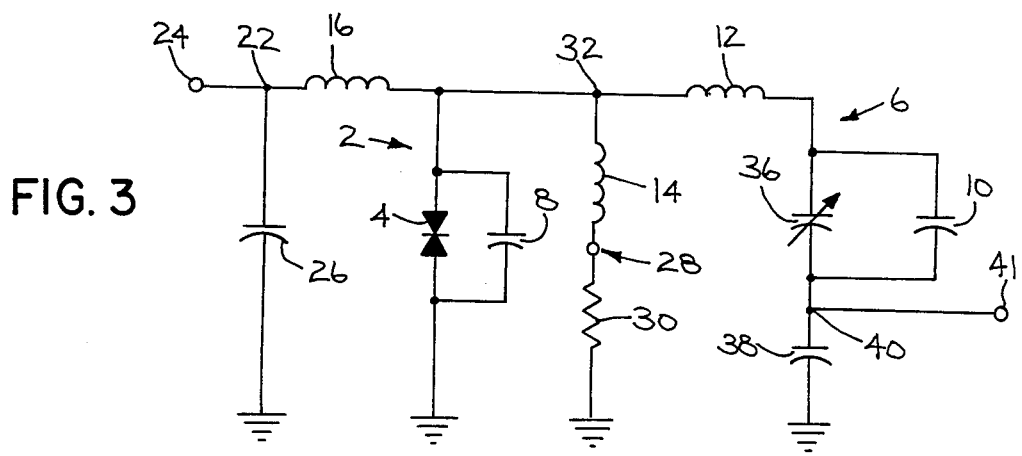
FIG. 3 is a circuit diagram showing another embodiment of an oscillator in accordance with the invention.

FIG. 1 is a circuit diagram showing a 30 GHz compensated fixed frequency lumped element Gunn oscillator in accordance with the invention, and FIG. 2 shows the packaged form in a ⅛ inch square package. FIG. 3 is a circuit diagram showing a lumped element varactor tuned Gunn oscillator (VCO), and uses like reference numerals from FIG. 1 where appropriate to facilitate clarity. FIG. 4 shows the packaging of the circuitry of FIG. 3. For further background regarding varactor tuned Gunn oscillators, reference is made to Cohen U.S. Pat. No. 4,246,550, and to "Varactor Tuned Gunn Oscillators with Wide Tuning Range for the 25 to 75 GHz Frequency Band", Cohen, IEEE-MTT-S, 79-6, pp. 1–3, 1979, each incorporated herein.

Each of FIGS. 1 and 3 shows a frequency versus temperature stabilized oscillator operational in the millimeter wave range including frequencies greater than 30 GHz. The oscillator includes a lumped element active circuit 2 including an active element 4 with a negative resistance, such as a Gunn or Impatt diode, FET, etc. The oscillator includes a lumped element circuit 6 in parallel with the active circuit. At least one of the circuits includes a lumped element temperature compensating capacitor 8 and/or 10 formed on material of dielectric constant less than about 15. The lumped element circuit concept is based on the use of circuit elements that are sufficiently small (electrically) that they are functionally characterized as lumped elements. The inductive elements 12 and 14 are short lengths of line that provide the electrical connection between discrete components. The lines are sufficiently short so that they are in effect lumped inductive elements. Line lengths are not critical since line inductance is trimmed by a simple adjustment of the height of the arced line above ground. The active element bias choke 16 is nominally a quarter wavelength long. Circuit package size is ⅛ inch at dimension 18 by ⅛ inch at dimension 20.

A Gunn diode active element bias port 22 is connected to an input coaxial line 24. A low pass RF bypass filter is provided by a chip capacitor 26 connected between the bias port and ground. Quarter wave choke 16 has a first terminal connected to bias port 22. Active circuit 2 has a first terminal connected to the second terminal of choke 16, and a second terminal connected to ground. Circuit 6 has a first terminal coupled to the second terminal of choke 16 and the first terminal of active circuit 2, and has a second terminal coupled through ground to the second terminal of active circuit 2. Load circuit 28, including inductor 14 and external load 30, is coupled at node 32 to the second terminal of choke 16 and the first terminal of active circuit 2 and the first terminal of circuit 6. Load 30 is connected to inductor 14 by RF output coaxial line 29.

In FIG. 1, circuit 6 includes series lumped inductor 12 and fixed resonator capacitor 34. In FIG. 3, the circuit includes series lumped inductor 12 and varactor capacitor 36, and also includes fixed chip capacitor 38. In FIG. 3, inductor 12 and varactor 36 and fixed capacitor 38 are all coupled in series, and node 40 between varactor 36 and capacitor 38 provides a varactor bias port connected to co-axial line 41. In each of FIGS. 1 and 3, there is at least one temperature compensating capacitor 8 and/or 10 in parallel with and lumped with a respective one of active element 4 of the active circuit 5 and capacitor 34 or 36 of circuit 6, and providing individual compensation thereof. Each of FIGS. 1 and 3 show the inclusion of both capacitors 8 and 10, though other embodiments delete one or the other of these capacitors. In FIG. 1, temperature compensating capacitor 8 is in parallel with and lumped with Gunn diode active element 4 and provides individual compensation thereof, and temperature compensating capacitor 10 is in parallel with and lumped with resonator capacitor 34 and provides individual compensation thereof. In FIG. 3, temperature compensating capacitor 8 is in parallel with and lumped with Gunn diode active element 4 and provides individual compensation thereof, and temperature compensating capacitor 10 is in parallel with and lumped with varactor 36 and provides individual compensation thereof.

Figure 5:
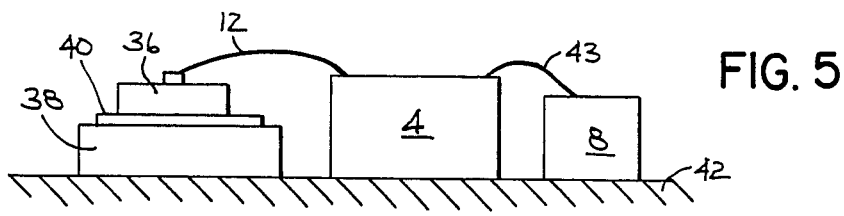
FIG. 5 is a side view of a portion of the structure in FIG. 4.

FIG. 5 is a side view of a portion of the packaging of FIG. 4. Temperature compensating capacitor 8 and Gunn diode active element 4 are discrete elements mounted adjacently on a substrate or ground plane 42 and electrically connected in parallel by jumper wire 43 as lumped components such that temperature compensating capacitor chip 8 provides individual compensation of active element 4. The resonant circuit includes discrete fixed capacitor chip 38 mounted on substrate ground plane 42 adjacent active element 4. The resonant circuit further includes discrete varactor chip 36 mounted on fixed capacitor chip 38 and connected to active element 4 by inductor line 12. The interface 40 of fixed capacitor chip 38 and varactor chip 36 provides the noted varactor tuning port 40.

Figure 6:
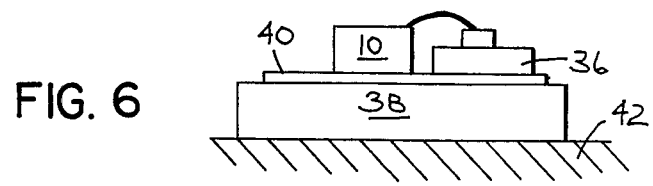
FIG. 6 is a side view of another portion of the structure in FIG. 4.

In FIG. 6, the resonant circuit includes fixed capacitor chip 38 mounted on substrate ground plane 42 and discrete varactor chip 36 mounted on fixed capacitor chip 38. Temperature compensating capacitor 10 is a discrete chip mounted on fixed capacitor chip 38 adjacent varactor chip 36. The interface 40 of fixed capacitor chip 38 and varactor chip 36 and temperature compensating capacitor chip 10 provides the noted varactor tuning port 40.

The circuit in FIG. 3 provides an oscillator in the Ka-band (26.5 to 40 GHz) and in one assembly version is assembled on the 0.118 inch diameter flange of a Gunn diode package, and is comparable in size to a match head, as shown in FIG. 2 of my first above noted article, and provides low thermal mass and rapid response to temperature change. The discrete circuit elements constituting the lumped element compensated VCO are the packaged Gunn diode 4, chip varactor 36, two chip RF bypass capacitors 26 and 38, and one or both frequency/temperature compensating capacitors 8 and 10. The VCO is a fundamental oscillator in which the chip varactor is used to series tune the packaged Gunn diode. The varactor is connected in series with chip capacitor 38 which provides a DC block and RF bypass for varactor bias. The basic simplicity of this VCO circuit, the small number of circuit elements, and the functional use of element interconnections as circuit inductive elements enable wide band, continuous, and spurious-free tuning to be achieved at microwave and millimeter wavelengths. The minimization of circuit parasitics is also favorable to low VCO frequency change with temperature.

A material parameter of interest for the temperature compensating capacitor is the temperature coefficient of dielectric constant. Frequency/temperature compensation is achieved by offsetting the capacitance/temperature characteristic of the Gunn and/or varactor diode with that of the compensating capacitor. Materials with a negative temperature coefficient of dielectric constant are used for compensation of oscillators, including VCO's exhibiting a negative frequency/temperature coefficient. Positive coefficient materials are appropriate for compensation of oscillators having a positive frequency/temperature coefficient. Broadband frequency/temperature compensation was achieved with this approach because a lumped element circuit is inherently more broadband than a distributed circuit and direct capacitance compensation is used.

Suitable materials for a frequency/temperature compensator capacitor in a lumped element oscillator, including a VCO, are listed below in Table I:

TABLE I

| Dielectric Material | Temperature Coefficient of Dielectric Constant of Various Materials Temperature Coefficient of Dielectric Constant (PPM/°C.) |
|---|---|
| Epsilam-10 (3M Company) | −570 |
| Kapton (DuPont Company) | −950 |
| Quartz | +45 |
| Silicon | +260 |
| Sapphire | +1100 |
| RT Duroid 5500 (Rogers Corp.) | −110 |
| RT Duroid 6010.5 (Rogers Corp.) | −370 |
| RT Duroid 5880 (Rogers Corp.) | −100 |

The materials in Table I are also suitable for use as the substrate for oscillators, including VCOs, in printed circuit form, to be described. Silicon has a dielectric constant $E_r$ of 11.8, sapphire has a dielectric constant $E_r$ of 11.5 and the remaining materials have a dielectric constant in the range 2.2 to 10. Material with low dielectric constant is advantageous for use in the millimeter range. Because the material for the temperature compensated capacitor can also serve as substrate material for a printed oscillator circuit, the compensator can be printed insitu with the circuit elements. Temperature compensation with a high dielectric constant titanium oxide dielectric has been reported in the above noted Kondo et al article for an avalanche diode oscillator at 9.2 GHz in a waveguide circuit. This material is not suitable for in-situ printing of compensated oscillators or for use at millimeter wavelengths.

The capacitance of the temperature compensating element when used in parallel with the Gunn diode package in a VCO circuit is given by:

$$C_c = \frac{1}{W^2[L_p - L_e']} + \frac{C_j}{W^2 L_T C_J - 1} - C_p \quad (1)$$

The capacitance of the compensating element when placed in parallel with the varactor in the Gunn VCO circuit is given by:

$$C_c = \frac{[L_e' - L_p]W^2 C_p + 1}{W^2[L_e' - L_p)(W^2 C_p L_T - 1) + L_T]} - C_j \quad (2)$$

$$\text{where } L_e' = \frac{1}{W^2 C_D} \quad (3)$$

$C_D$ = Domain capacitance of Gunn diode
$W$ = Resonant frequency of compensated VCO
$L_p$ = Gunn diode package inductance
$C_p$ = Gunn diode package capacitance
$L_T$ = Tuning inductance
$C_j$ = Varactor capacitance (average)

Figure 7:
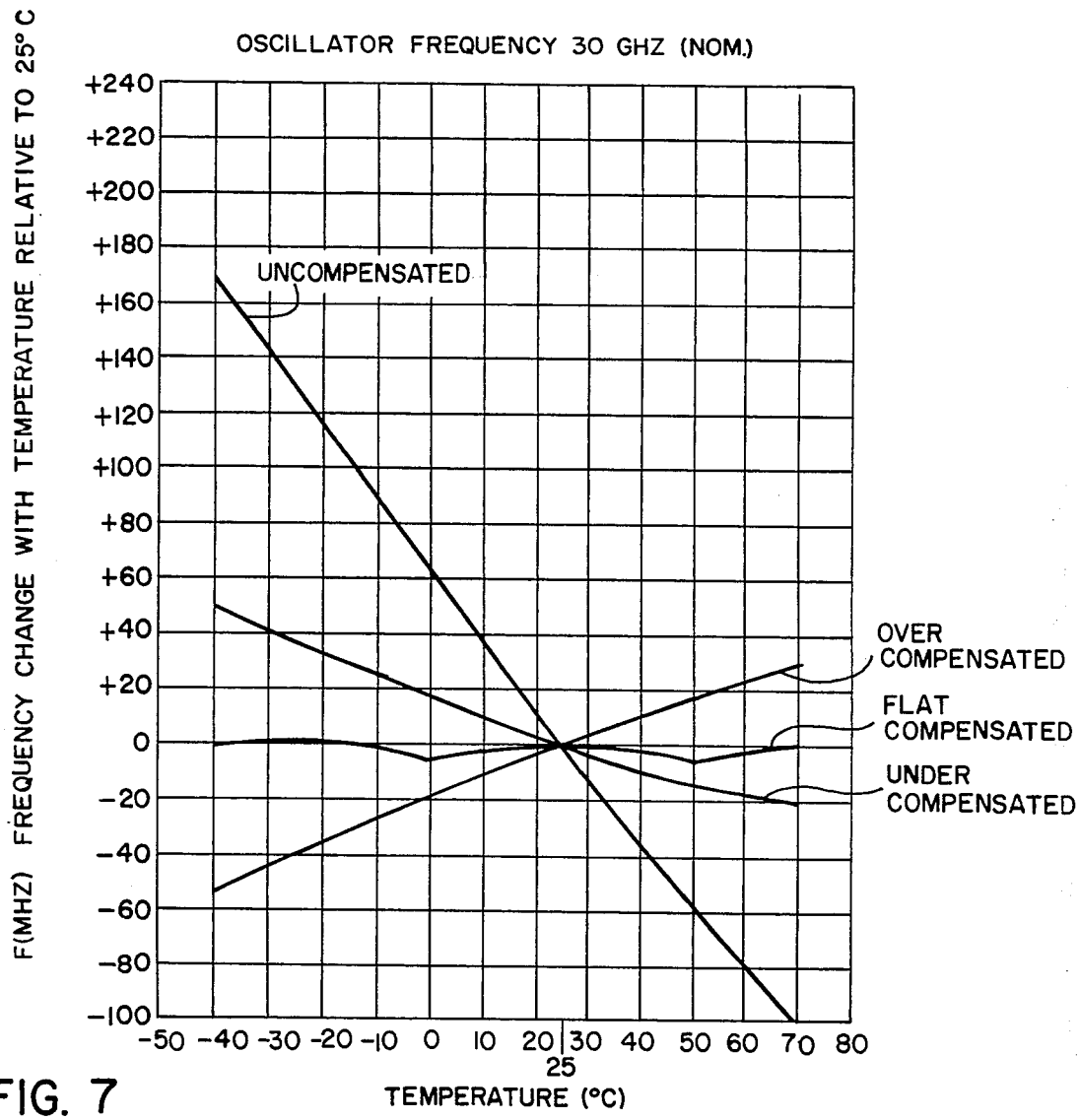
FIG. 7 is a graph comparing performance of an oscillator with and without a lumped element compensating capacitor.

The fixed frequency lumped element Gunn oscillator of FIG. 1 was tested over a −40° C. to +71° C. temperature range both with and without a temperature compensating element. The fixed resonator capacitor 34 was 5 mil thick metallized quartz. The compensating capacitor 8 was fabricated from 10 mil thick Epsilam-10 microwave material and was placed in parallel with the Gunn diode package. Epsilam-10 is copper clad ceramic filled teflon with a dielectric constant of 10.2, a dissipation factor of 0.002 and a temperature coefficient of dielectric constant of −570 ppm/°C. A comparison of the performance of this oscillator with and without a lumped element compensating capacitor is shown in FIG. 7 and is summarized below in Table II:

TABLE II

| Parameter | Uncompensated | Flat Compensated |
|---|---|---|
| Frequency (GHz) at 25° C. | 33.7 | 30.3 |
| Power (dBm) at 25° C. | +15.5 | +13.0 |
| Frequency/Temperature Stability (MHz/°C.) Over −40° to +71° C. | 2.45 (73 ppm/°C.) | 0.045 (1.5 ppm/°C.) |

Flat compensation refers to an oscillator whose compensated frequency/temperature characteristic has near zero slope. The performance with compensating capacitor values that resulted in over and under compensation is also shown. The compensating capacitor was sequentially trimmed in place from an over compensated value to the flat and undercompensated values in order to characterize the compensation capability of the technique. The capacitance values for the various degrees of compensation were as follows:

Under compensated: 0.057 picofarads
Flat compensated: 0.062 picofarads
Over compensated: 0.067 picofarads With flat compensation, the frequency/temperature sensitivity of the oscillator was reduced to 45 KHz/°C. (1.5 ppm/°C.), which corresponds to a near 50 times improvement over that of the uncompensated oscillator. The frequency of the compensated oscillator would be restored to the frequency before compensating by a resizing of inductance 12.

Frequency/temperature compensation of a broadband lumped element Gunn VCO with a 28.9 GHz center frequency was also demonstrated using the circuit in FIG. 3. A lumped element compensating capacitor fabricated from 5 mil thick metallized Kapton was used and was placed in parallel with the Gunn diode package. Kapton is plyimide material with dielectric constant of 3.5, a dissipation factor of 0.0025, and a temperature coefficient of dielectric constant of approximately −950 ppm/°C. The frequency/temperature characteristics of the uncompensated VCO over a temperature range −40° to +71° C. is shown in FIG. 8. The frequency/temperature coefficient of the VCO has an average value of 3.35 MHz/°C. (117 ppm/°C.) over the tuning range. This value was used in the design of the compensator that was placed in parallel with the Gunn diode package. The performance of the VCO with the compensator is shown in FIG. 9 and shows the effectiveness of the compensator in reducing frequency change with temperature over the broad tuning range (2.8 GHz) of the VCO. Least affected by the compensator was the upper 15% of the tuning range. The frequency/temperature performance would be uniformly improved over the tuning range if the value of the compensating capacitor was optimized. The compensator for this particular VCO was not optimized since the primary objective was to demonstrate that the compensation technique was applicable not only to fixed frequency oscillators but also to broadband VCOs. Optimization of a compensator had been demonstrated with a fixed frequency oscillator, FIG. 7, and the optimization of a VCO compensator would be accomplished in a similar manner. A comparison of the performance of the uncompensated and compensated VCO is summarized below in Table III:

TABLE III

| Parameter | Uncompensated | Compensated |
|---|---|---|
| Center Frequency (GHz) | 28.7 | 28.5 |
| Tuning Range (GHz) | 2.4 | 2.8 |
| Power (dBm) at midband and +25° C. | +7 | +5 |
| Frequency/Temperature Stability (MHz/°C.) Over −40° to +71° C. at Midband | 3.35 (117 ppm/°C.) | 0.79 (27.7 ppm/°C.) |

The 4.2 times improvement in the frequency/temperature coefficient of the VCO is conservative since the value of the compensating capacitor used was the first design value and was not thereafter optimized. Since a near 50 times improvement was obtained with an optimized compensator in the fixed frequency oscillator, significant improvement can be expected with an optimum VCO compensator.

Figure 10:
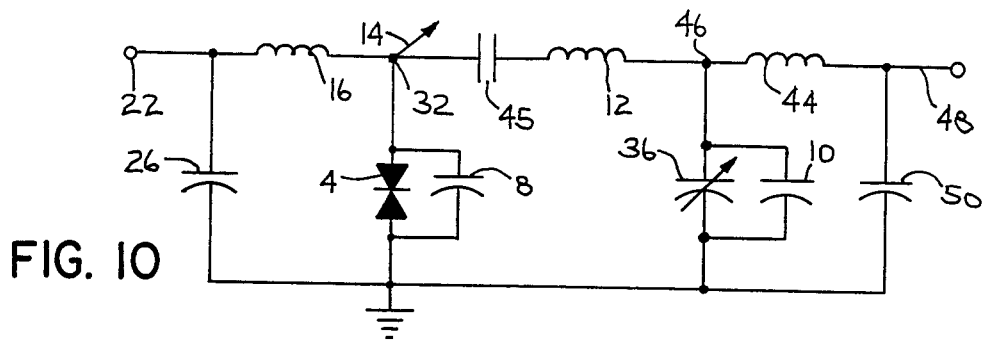
FIG. 10 is a circuit diagram showing another embodiment of an oscillator in accordance with the invention.

The VCO circuit in FIG. 3 has a common bias connection between Gunn diode 4 and varactor 36. Another circuit form providing isolation of the Gunn and varactor bias voltages is shown in FIG. 10, and like reference numerals are used from FIG. 3 where appropriate to facilitate clarity. A quarter wave choke 44 has a first terminal connected to a node 46 between inductor 12 and varactor 36 and has a second terminal 48 providing a varactor bias port. A DC blocking capacitor 45 is connected between inductor 12 and node 32. A filter capacitor 50 is provided by a low pass RF bypass capacitor connected between the second terminal 48 of choke 44 and the second grounded terminal of varactor 36. Load connection is to line 14 which is connected to node 32.

In a further embodiment, the resonator capacitor 34 is eliminated by a compensating capacitor 10 of proper value and in conjunction with a new value of inductance 12, providing a reduced number of circuit elements. In one embodiment of a 30 GHz compensated oscillator, circuit 6 includes an inductor 12 having an inductance on the order of 0.218 nanohenries and lumped in series with the temperature compensating capacitor 10 having a capacitor on the order of 0.0914 picofarads, and capacitor 34 is eliminated.

Figure 12:
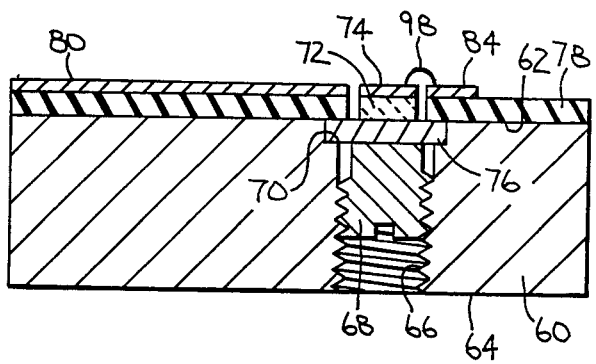
FIG. 12 is a side view of the structure in FIG. 11.
Figure 11:
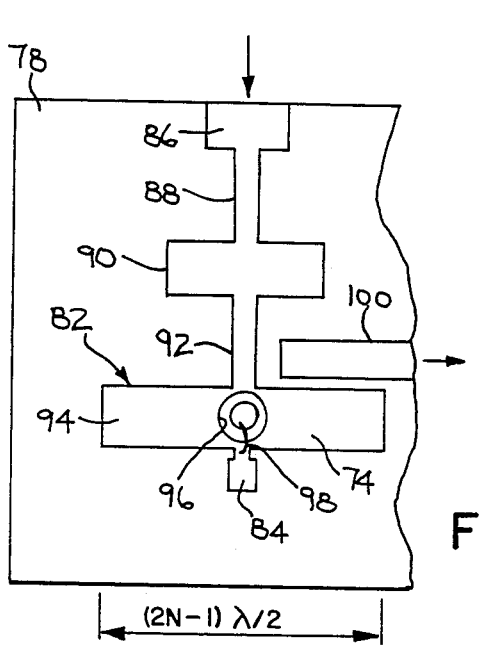
FIG. 11 is a top view of a microstrip printed circuit showing another embodiment of an oscillator in accordance with the invention.

FIG. 11 shows a printed circuit frequency versus temperature stabilized oscillator operational in the millimeter wave range including frequencies greater than 30 GHz. FIG. 12 shows a side sectional view of the structure of FIG. 11. FIGS. 11 and 12 show an electrically conductive metal heat sink and ground plane 60 having a top side 62 and a bottom side 64 with a threaded aperture 66 therethrough. A threaded metal stud 68 with an upper metal flange 70 has a Gunn diode mounted thereon including ceramic 72 and metallization 74. Stud 68 is threaded downwardly from top side 62 into aperture 66 until flange 70 seats in the counter bore 76 of aperture 66. Dielectric substrate 78 of dielectric constant less than about 15 is then provided on ground plane 60, which dielectric substrate has a copper clad printed circuit 80 formed thereon.

A resonant circuit 82 is printed in-situ on substrate 78 electrically in parallel with active element 72. A temperature compensating capacitor 84 is printed in-situ on the substrate in parallel with at least one of the active element and the resonant circuit. In the disclosed embodiment, microstrip transmission lines are printed on substrate 78 and include a low pass filter comprised of a widened strip low impedance line at bias port 86 connected by a narrower strip higher impedance transmission line 88 to a widened strip lower impedance line 90 in turn connected by a narrower strip higher impedance transmission line 92 to resonant circuit 82 and active element 72. Resonant circuit 82 is a widened strip 94 having a width $(2N-1)\lambda/2$, where N is an integer and $\lambda$ is wavelength. Widened resonant circuit strip 94 has a central opening 96 therein. Active element 72 is disposed within opening 96 and electrically connected to transmission line 92 via jumper 98 and strip 94.

Transmission line 92 is on one side of widened resonant printed circuit strip 94, and temperature compensating capacitor 84 is on the distally opposite side of widened resonant printed circuit strip 94 and has one plate printed on the upper surface of substrate 78 and the other plate formed by ground plane 60. A printed microstrip conductor 100 on the substrate extends perpendicularly to transmission line 92 and parallel to widened resonant printed circuit strip 94 for coupling therewith. In FIG. 11, the resonant circuit includes lumped element resonator capacitor 84 having one plate printed in-situ on a substrate and the other plate formed by the ground plane. The active element is mounted on the ground plane portion provided by flange 70 and is electrically connected to transmission line means 86, 88, 90, 92, printed resonator circuit strip 94 and to one plate of the resonator capacitor printed on the substrate. Printed metallization 94 provides both the resonator capacitor and inductance above noted.

Figure 13:
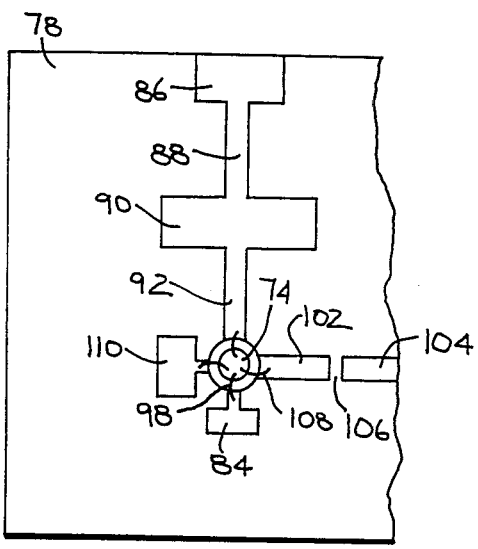
FIG. 13 is a top view of a microstrip printed circuit showing another embodiment of an oscillator in accordance with the invention.

FIG. 13 shows a further microstrip circuit version and uses like reference numerals from FIGS. 11 and 12 where appropriate to facilitate clarity. In FIG. 13, second microstrip transmission line means is printed on the substrate and has two sections 102 and 104 separated by a gap 106 providing a DC break. Section 102 is electrically connected by jumper 108 to active element 74 in common with transmission line 92 and the top plate of the resonator capacitor provided by metallization 110, and the top plate of temperature compensating capacitor 84.

Figure 14:
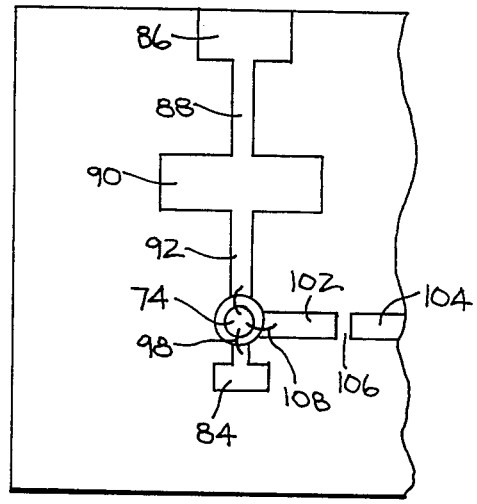
FIG. 14 is a top view of a microstrip printed circuit showing another embodiment of an oscillator in accordance with the invention.

In FIG. 14, the resonant circuit and the temperature compensating capacitor are provided by element 84 having an inductance on the order of 0.218 nanohenries and capacitance on the order of 0.0914 picofarads. Such capacitance means is provided by a capacitor having one plate printed in-situ on the substrate and sized on the order of 0.0140 inch by 0.0140 inch by 0.005 inch and having the other plate formed by ground plane 60. Such inductance means is provided by line 98.

Table IV below shows the values of circuit elements in uncompensated and compensated printed circuit oscillators:

TABLE IV

|  | Uncompensated Oscillator With Resonator 108 | Compensated Oscillators | |
|---|---|---|---|
|  |  | Individual Resonator & Compensating Capacitors FIG. 13 | Single Dual Function Capacitor (Resonator & Compensator) FIG. 14 |
| Frequency (GHz) | 30 | 30 | 30 | 30 |
| 110-Resonator Capacitor (pF) | 0.080 | 0.0853 | 0.080 | Common Capacitor 0.0914 |
| 84-Compensating Capacitor (pF) | 0 | 0.102 | 0.102 | Size .0140 × .0140 × .005 |
| Size of Compensating Capacitor (inches) Epsilom 10 Material | 0 | .0148 × .0148 × .005 | .0148 × .0148 × .005 |  |
| Inductance of line 98 (nH) | 0.196 | 0.196 | 0.218 | 0.218 |

It is recognized that various equivalents, alternatives, and modifications are possible within the scope of the appended claims.

I claim:

1. A frequency versus temperature stabilized oscillator operational in the millimeter wave range including frequencies greater than 30 GHz, comprising:
   a lumped element circuit including an active element with a negative resistance;
   a lumped element circuit in parallel with first mentioned active circuit;
   at least one of said circuits including a lumped element temperature compensating capacitor formed on material of dielectric constant less than about 15.

2. The invention according to claim 1 comprising:
   a bias port;
   a quarter wave choke having first and second terminals, said first terminal coupled to said bias port;
   said first circuit having first and second terminals, said first terminal of said first circuit being coupled to said second terminal of said choke;
   said second mentioned circuit having first and second terminals, said first terminal of said second circuit being coupled to said second terminal of said choke and said first terminal of said first circuit, said second terminal of said second circuit being coupled to said second terminal of said first circuit;

a load circuit coupled to said second terminal of said choke and said first terminal of said first circuit and said first terminal of said second circuit.

3. The invention according to claim 1 wherein said second mentioned circuit comprises a series lumped inductor and capacitor, and comprising at least one said temperature compensating capacitor in parallel with and lumped with a respective one of said active element and said capacitor of said second circuit and providing individual compensation thereof.

4. The invention according to claim 3 comprising first and second temperature compensating capacitors, said first temperature compensating capacitor being in parallel with and lumped with said active element and providing individual compensation thereof, said second temperature compensating capacitor being in parallel with and lumped with said capacitor of said second circuit and providing individual compensation thereof.

5. The invention according to claim 3 wherein said capacitor of said second circuit comprises a varactor and said second circuit also comprises a fixed capacitor, said varactor and said inductor and said last mentioned fixed capacitor being coupled in series, a node between said varactor and said last mentioned fixed capacitor providing a varactor bias port.

6. The invention according to claim 5 wherein said temperature compensating capacitor is in parallel with and lumped with said active element and provides individual compensation thereof.

7. The invention according to claim 6 comprising a second temperature compensating capacitor in parallel with and lumped with said varactor and providing individual compensation thereof.

8. The invention according to claim 5 wherein said temperature compensating capacitor is in parallel with and lumped with said varactor and provides individual compensation thereof.

9. The invention according to claim 3 wherein said capacitor of said second circuit comprises a varactor, and comprising a quarter wave choke having a first terminal connected to a node between said inductor and said varactor and having a second terminal providing a varactor bias port.

10. The invention according to claim 3 wherein said capacitor of said second circuit comprises a varactor, and comprising:
a quarter wave choke having first and second terminals, said first terminal providing a bias port;
said first circuit having first and second terminals, said first terminal of said first circuit being coupled to said second terminal of said choke;
a filter capacitor connected between said first terminal of said choke and said second terminal of said first circuit;
said inductor having first and second terminals, said first terminal of said inductor being coupled through a DC blocking capacitor to said second terminal of said choke and said first terminal of said first circuit;
said varactor having first and second terminals, said first terminal of said varactor being coupled to said second terminal of said inductor, said second terminal of said varactor being coupled to said second terminal of said first circuit;
a second quarter wave choke having first and second terminals, said first terminal of said second quarter wave choke being coupled to said second terminal of said inductor and said first terminal of said varactor, said second terminal of said second quarter wave choke providing a varactor bias port;
a second filter capacitor connected between said second terminal of said second choke and said second terminal of said varactor.

11. The invention according to claim 3 wherein said capacitor of said second circuit comprises a varactor, and comprising:
a quarter wave choke having first and second terminals, said first terminal providing a bias port;
said first circuit having first and second terminals, said first terminal of said first circuit being coupled to said second terminal of said choke;
a filter capacitor connected between said first terminal of said choke and said second terminal of said first circuit;
said inductor having first and second terminals, said first terminal of said inductor being coupled to said second terminal of said choke and said first terminal of said first circuit;
said varactor having first and second terminals, said first terminal of said varactor being coupled to said second terminal of said inductor, said second terminal of said varactor providing a varactor bias port;
a second filter capacitor connected between said second terminal of said varactor and said second terminal of said first circuit.

12. The invention according to claim 1 wherein said temperature compensating capacitor and said active element are discrete elements mounted adjacently on a substrate and electrically connected in parallel as lumped components such that said temperature compensating capacitor provides individual compensation of said active element.

13. The invention according to claim 12 wherein said second circuit comprises a discrete fixed capacitor mounted on said substrate adjacent said active element, and wherein said second circuit further comprises a discrete varactor mounted on said fixed capacitor, and wherein the interface of said fixed capacitor and said varactor provides a varactor tuning port.

14. The invention according to claim 1 wherein said second mentioned circuit comprises a discrete fixed capacitor mounted on a substrate and a discrete varactor mounted on said fixed capacitor, and wherein said temperature compensating capacitor is a discrete element mounted on said fixed capacitor adjacent said varactor, and wherein the interface of said fixed capacitor and said varactor and said temperature compensating capacitor provides a varactor tuning port.

15. The invention according to claim 1 wherein said second mentioned circuit comprises an inductor having an inductance on the order of 0.218 nanohenries lumped in series with said temperature compensating capacitor having a capacitance on the order of 0.0914 picofarads.

16. A frequency versus temperature stabilized oscillator operational in the millimeter wave range including frequencies greater than 30 GHz, comprising:
a ground plane;
a substrate on said ground plane and having a dielectric constant less than about 15;
an active element mounted on a portion of said ground plane and having a negative resistance;
a resonant circuit printed in-situ on said substrate and electrically in parallel with said active element;
temperature compensating capacitor means printed in-situ on said substrate in parallel with at least one of said active element and said resonant circuit.

17. The invention according to claim 16 comprising microstrip transmisson line means printed on said substrate and connected to said resonant circuit and to said active element.

18. The invention according to claim 17 wherein said resonant circuit comprises a widened strip having a width $(2N-1)\lambda/2$, where N is an integer and $\lambda$ is wavelength, and wherein said widened resonant circuit strip has a central opening therein, and wherein said active element is disposed within said opening and electrically connected to said transmission line means.

19. The invention according to claim 18 wherein said transmission line means is on one side of said widened resonant printed circuit strip, and wherein said temperature compensating capacitor means is on the distally opposite side of said widened resonant printed circuit strip and has one plate printed on said substrate and the other plate formed by said ground plane.

20. The invention according to claim 19 comprising a printed microstrip conductor on said substrate extending perpendicularly to said first mentioned transmission line means and parallel to said widened resonant printed circuit strip for coupling therewith.

21. The invention according to claim 17 wherein said resonant circuit comprises a lumped element resonator capacitor having one plate in-situ on said substrate and the other plate formed by said ground plane, and wherein said active element is mounted on said ground plane and electrically connected to said transmission line means and to said one plate of said resonator capacitor printed on said substrate.

22. The invention according to claim 21 wherein said temperature compensating capacitor means comprises a lumped element temperature compensating capacitor having one plate printed in-situ on said substrate and the other plate formed by said ground plane, said one plate of said temperature compensating capacitor being electrically connected to said active element in common with said transmission line means and said one plate of said resonator capacitor.

23. The invention according to claim 22 comprising second microstrip transmission line means printed on said substrate, said second transmission line means having two sections separated by a gap providing a DC break, one of said sections of said second transmission line means being electrically connected to said active element in common with said first transmission line means, said one plate of said resonator capacitor, and said one plate of said temperature compensating capacitor.

24. The invention according to claim 17 wherein said resonant circuit and said temperature compensating capacitor means comprise inductance means having an inductance on the order of 0.218 nanohenries and capacitance means having a capacitance on the order of 0.0914 picofarads.

25. The invention according to claim 24 wherein said inductance means and said capacitance means comprise a capacitor having one plate printed in-situ on said substrate and sized on the order of 0.0140 inch by 0.0140 inch by 0.005 inch and having the other plate formed by said ground plane.

26. The invention according to claim 25 comprising second microstrip transmission line means printed on said substrate, said second transmission line means having two sections separated by a gap providing a DC break, one of said sections of said second transmission line means being electrically connected to said active element in common with said first transmission line means and said one plate of said last mentioned capacitor.

* * * * *